(12) United States Patent (10) Patent No.: US 7,327,449 B2
Fukuhara et al. (45) Date of Patent: Feb. 5, 2008

(54) EXPOSURE APPARATUS INSPECTION METHOD AND EXPOSURE APPARATUS

(75) Inventors: Kazuya Fukuhara, Tokyo (JP); Soichi Inoue, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/806,976

(22) Filed: Jun. 5, 2007

(65) Prior Publication Data

US 2007/0236691 A1  Oct. 11, 2007

Related U.S. Application Data

(62) Division of application No. 10/650,013, filed on Aug. 28, 2003.

(30) Foreign Application Priority Data

Aug. 30, 2002 (JP) .............................. 2002-255210

(51) Int. Cl.
*G01N 21/00* (2006.01)
(52) U.S. Cl. .................................. 356/237.1
(58) Field of Classification Search .. 356/237.1–237.6, 356/122–124; 355/53–77; 430/5, 269, 322–324
See application file for complete search history.

(56) References Cited

U.S. PATENT DOCUMENTS

| | | | | |
|---|---|---|---|---|
| 4,848,903 A | * | 7/1989 | Fendt | 356/141.1 |
| 5,392,094 A | * | 2/1995 | Kudo | 355/67 |
| 5,610,684 A | * | 3/1997 | Shiraishi | 355/55 |
| 5,973,771 A | * | 10/1999 | Hibbs et al. | 356/121 |
| 5,978,085 A | | 11/1999 | Smith et al. | |
| 6,048,651 A | | 4/2000 | Brunner et al. | |
| 6,163,376 A | * | 12/2000 | Nomura et al. | 356/401 |

(Continued)

FOREIGN PATENT DOCUMENTS

| | | |
|---|---|---|
| CN | 1136708 A | 11/1996 |
| CN | 90107655 | 5/2002 |
| JP | 61-210627 | 9/1986 |
| JP | 03-065623 | 3/1991 |

(Continued)

OTHER PUBLICATIONS

Kirk et al., "Pupil Illumination; in situ measurement of partial coherence," SPIE, 3334:281-288.

(Continued)

*Primary Examiner*—Taripur Chowdhury
*Assistant Examiner*—Isiaka O Akanbi
(74) *Attorney, Agent, or Firm*—Finnegan, Henderson, Farabow, Garrett & Dunner, L.L.P.

(57) ABSTRACT

An inspection method for an exposure apparatus for illuminating a photomask on a first installation member by an illumination optical system, and for projecting an image of a pattern of the photomask onto a substrate on a second installation member through a projection optical system, the inspection method comprises disposing an inspection photosensitive substrate as the substrate on the second installation member, illuminating a first region which doesn't include a pupil end of the projection optical system and a second region which includes the pupil end of the projection optical system and which isn't overlapped with the first region, in a state in which a surface of the photosensitive substrate and a surface of a secondary light source of the illumination optical system are optically conjugate with each other, and inspecting an illumination axis offset of the exposure apparatus based on a pattern obtained by developing the photosensitive substrate.

14 Claims, 7 Drawing Sheets

U.S. PATENT DOCUMENTS 6,262,793 B1 * 7/2001 Sasaya et al. .................. 355/53
6,317,198 B1 * 11/2001 Sato et al. .................... 355/77
6,356,345 B1   3/2002 McArthur et al.
6,822,740 B2 * 11/2004 Nomura ..................... 356/401

FOREIGN PATENT DOCUMENTS

| | | |
|---|---|---|
| JP | 2000-021732 | 1/2000 |
| JP | 2001-330964 | 11/2001 |
| JP | 2002-083761 | 3/2002 |

OTHER PUBLICATIONS

Notification of the First Office Action from the State Intellectual Property Office of the People's Republic of China dated Apr. 8, 2005, in patent application No. 031560024, and English translation.
Sato, K. et al., "Measurement of effective source shift using a grating-pinhole mask", Proceedings of SPIE—The International Society for Optical Engineering, vol. 3679, pp. 99-107, (Mar. 17-19, 1999).
Notification of Reasons for Rejection, mailed Jan. 30, 2007, in Japanese counterpart Application No. 2002-255210.
Search Report mailed on Jun. 1, 2007, by the Dutch Patent Office in Dutch patent application No. 1024195.

* cited by examiner

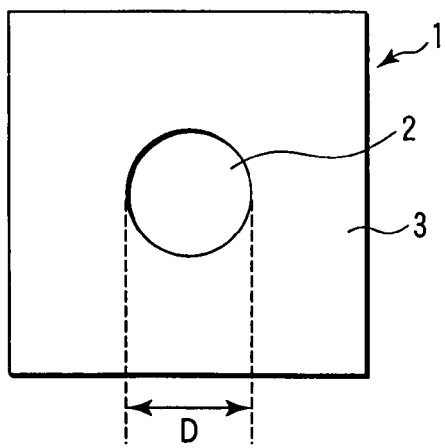
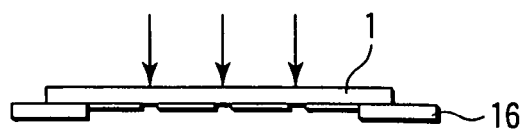
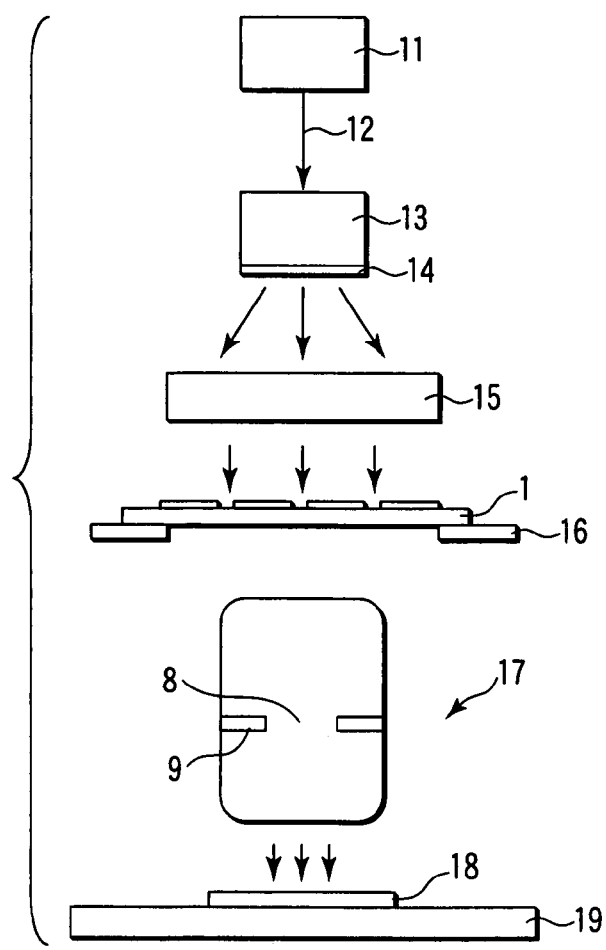
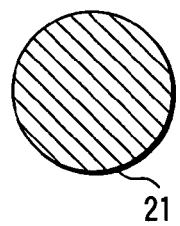
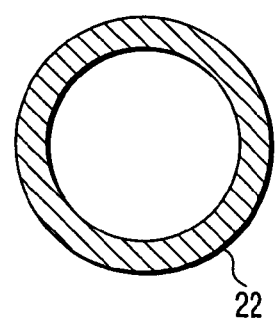
FIG. 1
FIG. 3
FIG. 2
FIG. 4A
FIG. 4B

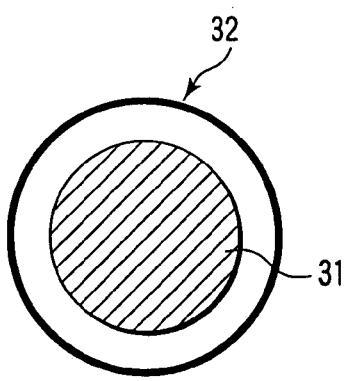
FIG. 5A
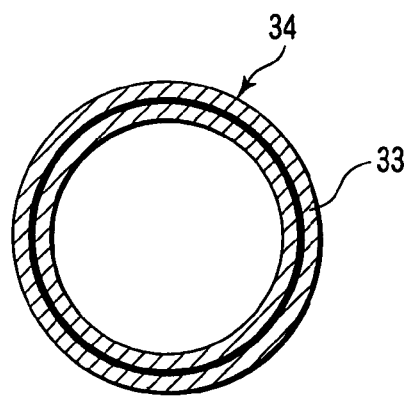
FIG. 5B
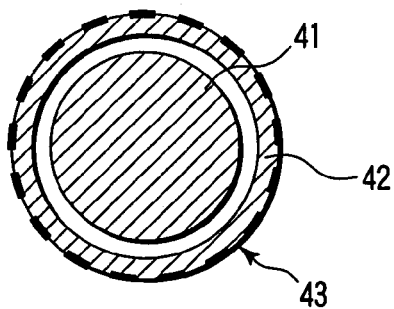
FIG. 6
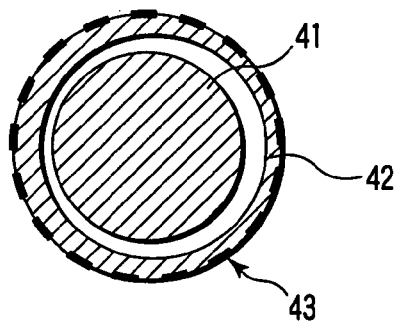
FIG. 7
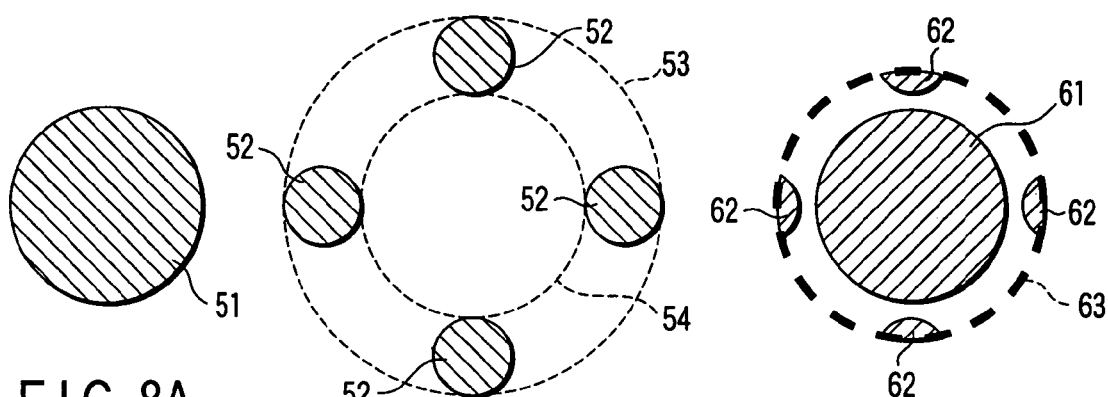
FIG. 8A
FIG. 8B
FIG. 9

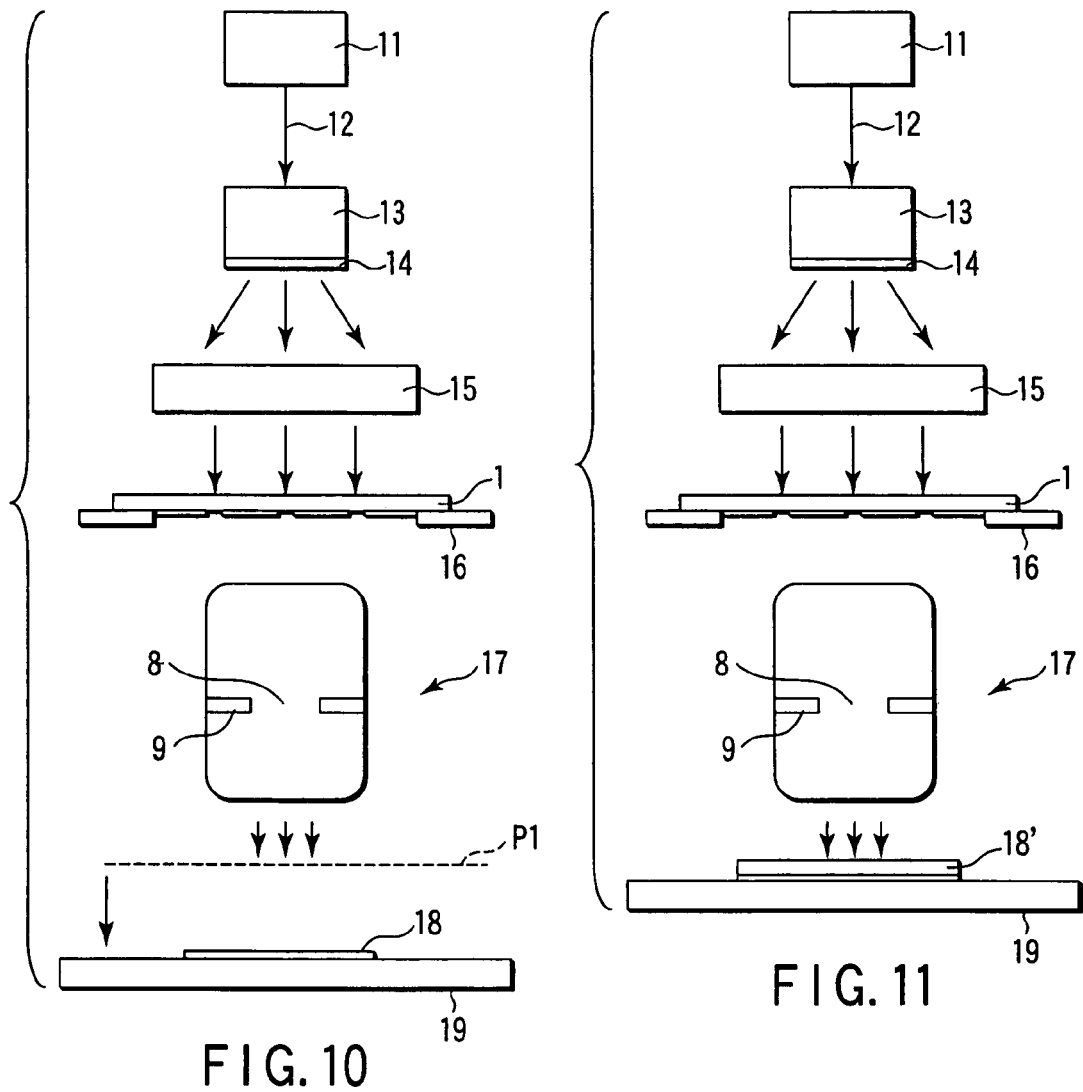
FIG. 10
FIG. 11
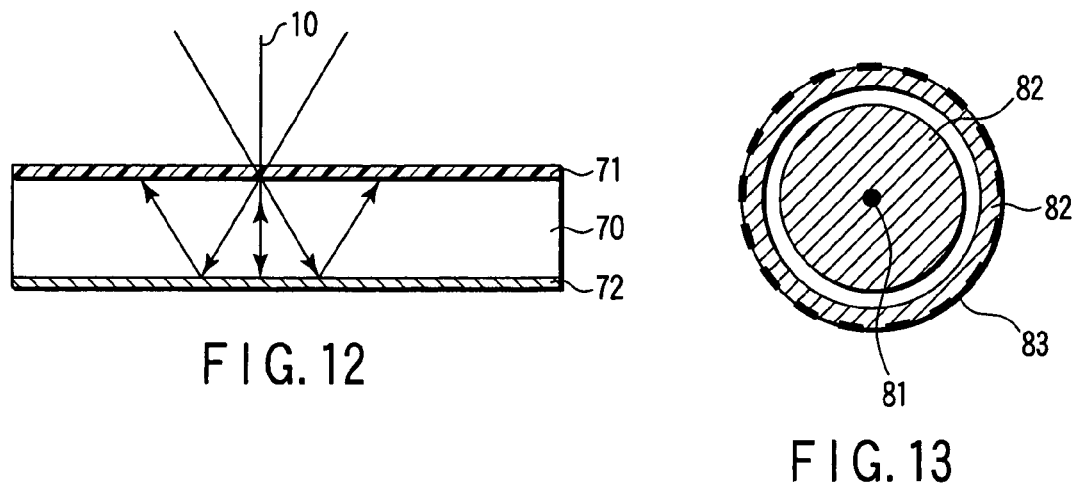
FIG. 12
FIG. 13

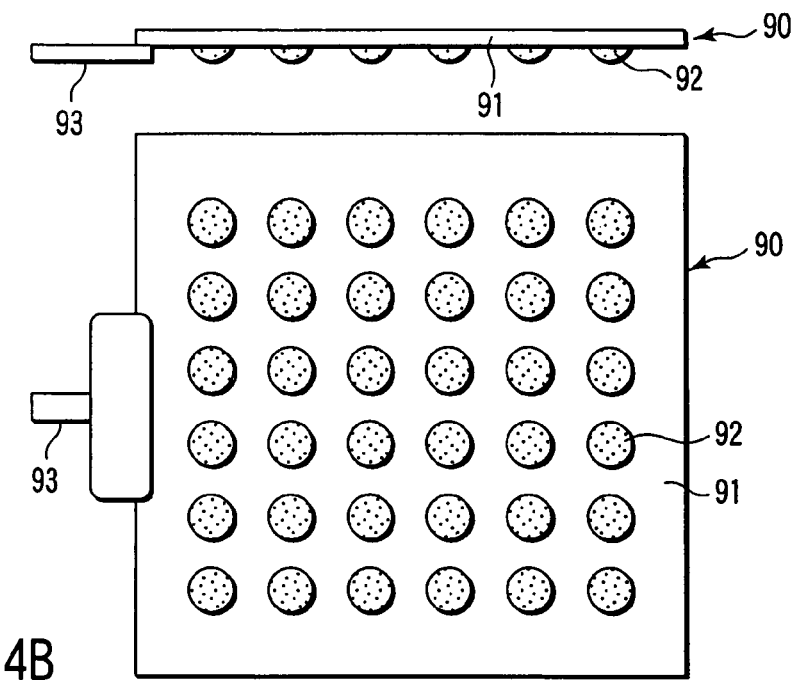
FIG. 14A
FIG. 14B
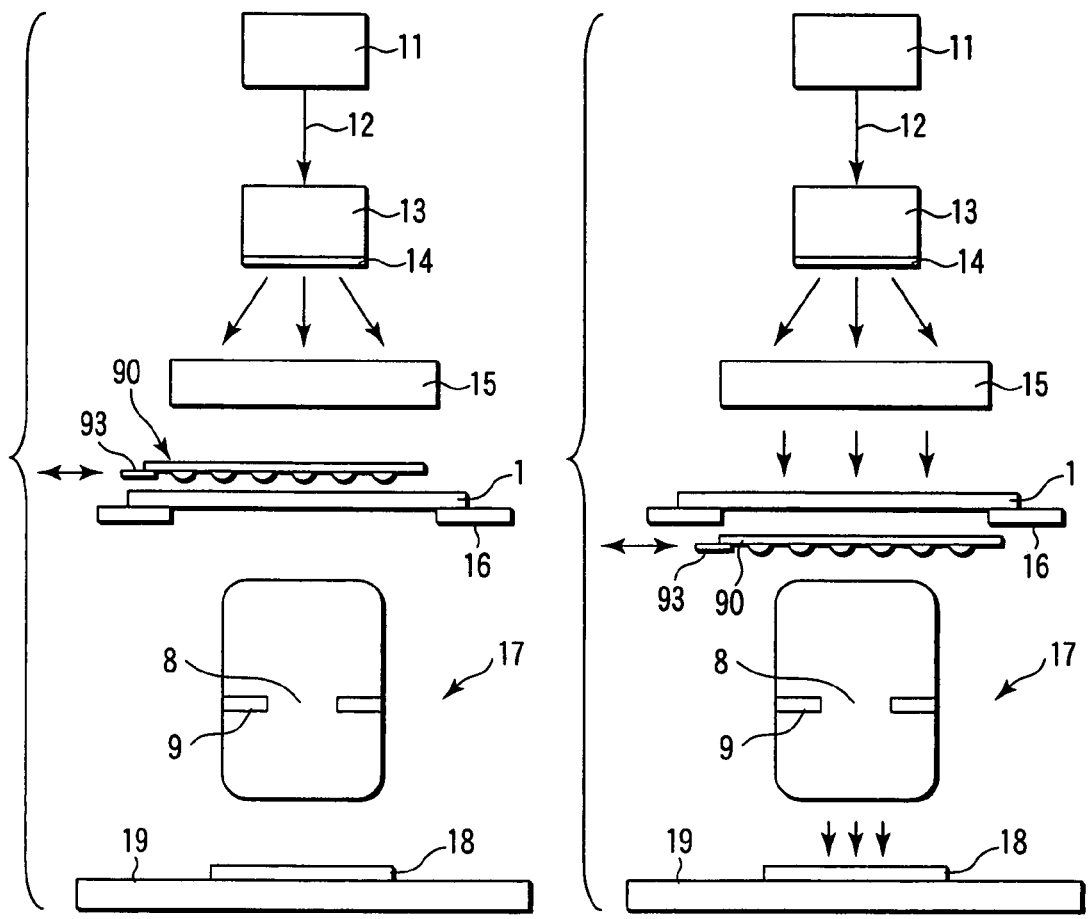
FIG. 15    FIG. 17

EXPOSURE APPARATUS INSPECTION METHOD AND EXPOSURE APPARATUS

CROSS-REFERENCE TO RELATED APPLICATIONS

This is a divisional application of application Ser. No. 10/650,013, filed Aug. 28, 2003, which is based upon and claims the benefit of priority from the prior Japanese Patent Application No. 2002-255210, filed Aug. 30, 2002, the entire contents of all of which are incorporated herein by reference.

BACKGROUND OF THE INVENTION

1. Field of the Invention

The present invention relates to an exposure apparatus inspection method used in a semiconductor device manufacturing process and an exposure apparatus for facilitating the inspection method.

2. Description of the Related Art

One of the important matters to keep the yield of a semiconductor device high is to maintain an exposure apparatus used in a photolithographic step in a normal image formation state. To do so, a technique for inspecting and monitoring the state of the exposure apparatus by a simple method is required.

If the shape and brightness distribution of the secondary light source of the exposure apparatus change, the characteristic of the exposure apparatus related to the image formation of a mask pattern on a substrate surface changes. Accordingly, it is necessary to constantly inspect the illumination optical system of the exposure apparatus so as to keep the illumination optical system in the same state.

Factors for the error of the illumination optical system that may influence the image formation characteristic of the exposure apparatus include a phenomenon (illumination axis offset) that an illumination light incident on a photomask is inclined as a whole in addition to the shape and brightness distribution of the secondary light source.

The influence of the illumination axis offset will be explained with reference to FIGS. 19A and 19D.

In a state of no illumination axis offset (FIGS. 19A to 19B), there is no positional deviation between a resist pattern 103A which is obtained by exposure of a light 102A while a substrate (photosensitive substrate) 100 having a resist applied onto a wafer is located on an image plane 101 (in a best focus state) and resist patterns 103B, 103C which are obtained by exposure of lights 102B and 102C, respectively, in a state slightly defocused from the best focus. Due to this, the exposure apparatus in a state in which no illumination axis offset occurs is less influenced by the change of focus.

On the other hand, in a state of illumination axis offset (FIGS. 19C to 19D), the formation positions of resist patterns 103A to 103C are shifted laterally by the defocus of the photosensitive substrate 100. Due to this, a desired pattern may not be possibly formed in an entire exposure region. This causes an increase in the number of defects.

Such a disadvantage can be prevented by inspecting whether illumination axis offset occurs, and stopping the exposure apparatus to conduct maintenance on the system if it is determined that illumination axis offset occurs. The inspection of the shape, that of the brightness distribution, and that of the illumination axis offset of the secondary light source will be referred to as "the inspection of the illumination optical system" hereinafter.

To inspect a semiconductor device manufacturing apparatus, a method for simply measuring the apparatus in a short time and without stopping the apparatus is desirous. Illumination optical system inspection methods that satisfy this requirement are as follows.

An aperture pattern around which light is shield (pinhole pattern) is prepared, and the aperture pattern is located at a position non-conjugate with the surface of the photosensitive substrate. Using the aperture pattern thus located, exposure is performed. As a result of the exposure, an image of the secondary light source is formed on the photosensitive substrate. Based on the secondary light source image, the shape of the secondary light source or brightness distribution thereof is measured (U.S. Pat. No. 5,973,771, Proceedings of SPIE vol. 3334, pp. 281-288).

According to this method, the aperture pattern is made to function as a lens of a pinhole camera to thereby transfer the secondary light source image onto the photosensitive substrate and the inspection is conducted by observing the transferred image.

There is known another inspection method for acquiring a secondary light source transferred image using not a simple aperture pattern, but a zone plate (U.S. Pat. No. 6,048,651).

However, illumination axis offset cannot be recognized according to these two methods disclosed in the above-identified documents for the following reasons.

A pattern formed on the photosensitive substrate is an image that represents the brightness distribution of the secondary light source. The image contains no information on a projection optical system. Due to this, even if the transferred image is observed, it cannot be determined whether the verticality of an illumination light relative to the projection optical system is maintained.

As a method for measuring the shape or brightness distribution of the secondary light source and, at the same time, measuring an illumination axis offset, there is known a measurement method using a pattern (grating pinhole pattern, see, for example, FIG. 20) having a diffraction grating disposed inside of an aperture pattern around which light is shielded (U.S. Pat. No. 6,317,198). In this method, a diffracted light generated by the diffraction grating is used. Using the diffracted light, the position of a diaphragm that specifies the numerical aperture of the projection optical system is transferred onto the photosensitive substrate simultaneously with the brightness distribution of the secondary light source.

FIG. 21 illustrates one example of a pattern formed on the photosensitive substrate by the above-stated method. A 0th-order diffracted light image 110 contains information on the brightness distribution of the secondary light source. A 1st-order diffracted light image (profile image) 111 contains information on the position of the profile of the diaphragm. The positional deviation between the center of the 0th-order diffracted light image 110 and the center of the diaphragm profile image 111 represents the amount of illumination axis offset.

According to this method, however, the pitch of the diffraction grating on a photomask used in the inspection is required to be set quite small. This will be explained concretely as follows.

The pitch of the diffraction grating on the photomask used in the inspection of the illumination optical system has two restriction conditions related to a diffracted light. Namely, it is necessary to set the pitch of the diffraction grating so that the 0th-order diffracted light image is not overlapped with the 1st-order diffracted light image and so that the primary diffracted light passes through the diaphragm position (pupil end).

If the state of an exposure apparatus having an exposure wavelength of 193 nm and a projection reduction ratio of 1/4 in which the emission-side numerical aperture (NA) of a projection optical system is set at 0.68 and a coherence factor ($\sigma$) is set at 0.75 is inspected, the appropriate pitch of the diffraction grating necessary to satisfy the two conditions is approximately 0.64 µm. If this pitch is converted into a scale on the photosensitive substrate, it is a half pitch of 0.08 µm. This half pitch is smaller than the minimum half pitch of a repetition pattern of 0.13 to 0.11 µm used in currently mass-produced semiconductor devices.

To create a photomask having such a fine pattern, an advanced technique is required, which disadvantageously pushes up cost. Thus, it is difficult to inspect the illumination axis offset of the exposure apparatus at as low a cost as in the prior art.

BRIEF SUMMARY OF THE INVENTION

An inspection method according to an aspect of the present invention for an exposure apparatus for illuminating a photomask disposed on a first installation member by an illumination optical system, and for projecting an image of a pattern of the photomask onto a substrate disposed on a second installation member through a projection optical system, the inspection method comprises disposing an inspection photosensitive substrate as the substrate on the second installation member; illuminating a first region which does not include a pupil end of the projection optical system and a second region which includes the pupil end of the projection optical system and which is not overlapped with the first region, in a state in which a surface of the photosensitive substrate and a surface of a secondary light source of the illumination optical system are optically conjugate with each other; and inspecting an illumination axis offset of the exposure apparatus based on a pattern obtained by developing the photosensitive substrate.

An exposure apparatus according to an aspect of the present invention comprises a first installation member on which a photomask is disposed; an illumination optical system for illuminating a pattern formed on the photomask disposed on the first installation member; a second installation member on which a substrate is disposed; a projection optical system for projecting the image of the pattern of the photomask onto the substrate disposed on the second installation member; and a lens member arranged into an optical path between a surface of a secondary light source of the illumination optical system and the projection optical system or into an optical path between the projection optical system and the substrate.

BRIEF DESCRIPTION OF THE SEVERAL VIEWS OF THE DRAWING

FIG. 1 is a plan view illustrating a photomask used in an exposure apparatus inspection method in a first embodiment;

FIG. 2 is a typical view illustrating a state in which the photomask in the first embodiment is set in a well-known exposure apparatus to be inspected;

FIG. 3 is an illustration of the direction of a pattern surface of the photomask when a semiconductor device pattern is exposed;

FIGS. 4A and 4B are plan views illustrating the illumination shape of a secondary light source employed in the first embodiment;

FIGS. 5A and 5B are illustrations of the position of a light flux emitted from the secondary light source during first and second exposures on a pupil surface of a projection optical system and a diaphragm position thereof;

FIG. 6 is a plan view illustrating a resist pattern formed on a photosensitive substrate when the illumination shapes of the secondary light source shown in FIGS. 4A and 4B are used;

FIG. 7 is a plan view illustrating a resist pattern formed on the photosensitive substrate when the illumination shape of the secondary light source in a modified embodiment is used;

FIGS. 8A and 8B are plan views illustrating illumination shapes of a secondary light source in a second embodiment;

FIG. 9 is a plan view illustrating a resist pattern formed on a photosensitive substrate when the illumination shapes of the secondary light source shown in FIGS. 8A and 8B are used;

FIG. 10 is an illustration for explaining an exposure apparatus inspection method in a third embodiment;

FIG. 11 is an illustration for explaining an exposure apparatus inspection method in a fourth embodiment;

FIG. 12 is a cross-sectional view illustrating a photosensitive substrate used in the exposure apparatus inspection method;

FIG. 13 is a plan view illustrating a resist pattern formed on the photosensitive substrate;

FIGS. 14A and 14B are a side view and a top view illustrating a lens array in a fifth embodiment, respectively;

FIG. 15 is an illustration of an exposure apparatus in which the lens array in the fifth embodiment is inserted into an optical path so as to inspect an illumination optical system;

FIG. 17 is an illustration for explaining an exposure apparatus inspection method in a sixth embodiment;

DETAILED DESCRIPTION OF THE INVENTION

Figure 16A:
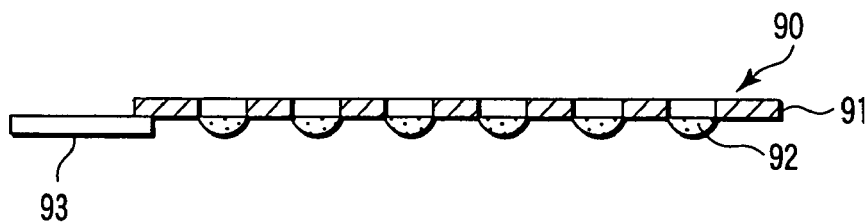
FIGS. 16A and 16B are a side view and a plan view illustrating a modification of the lens array shown in FIGS. 14A and 14B, respectively.

Embodiments of the present invention will be described hereinafter with reference to the drawings.

FIRST EMBODIMENT

FIG. 1 is a plan view illustrating an inspection photomask (to be simply referred to as "photomask" hereinafter) used in an exposure apparatus inspection method in a first embodiment.

The photomask 1 (pattern member) has a thickness of 6.35 mm (0.25 inches), and comprises a quartz substrate (not shown) serving as a transparent substrate and a light shielding film 3 made of a laminate film of a chromium film and a chromium oxide film that are sequentially deposited on this quartz substrate, and having a circular aperture portion 2 (aperture pattern) of a diameter D of 55 µm. The thickness of the quartz substrate is not limited to 6.35 mm but may be within a range of 1 mm or more and less than 10 mm.

There is not provided another circular aperture portion in a region of 200 µm or less from an end of the circular aperture portion 2. That is, the photomask 1 is made so that a light passed through the circular aperture portion 2 and a light passed through a circular aperture portion other than the circular aperture portion 2 are not applied onto the same part. Further, no light shielding region, such as a diffraction grating, is provided in the circular aperture portion 2.

Since the photomask 1 does not have a fine pattern, it is easy to manufacture the photomask 1. Therefore, the photomask 1 takes lower manufacturing cost than the conventional photomask having a fine diffraction grating pattern.

The exposure apparatus inspection method using the photomask 1 will next be described.

FIG. 2 is a typical view illustrating a state in which the photomask 1 in the present embodiment is set in a well-known exposure apparatus to be inspected. The photomask 1 functions as a pinhole camera. The function of the pinhole camera enables the surface of a secondary light source 14 of an illumination optical system 13 and the surface of a photosensitive substrate 18 to be optically conjugate with each other.

In FIG. 2, reference symbol 11 denotes a light source such as an excimer laser light source or a mercury lamp. An exposure light 12 emitted from this light source 11 is shaped through the illumination optical system 13, and the secondary light source 14 is formed.

A plurality of aperture masks, not shown, are provided on the surface of the secondary light source 14 to be designed so that arbitrary one of the aperture masks can be selected. Therefore, the illumination shape of the secondary light source 14 corresponds to a opening (aperture) of the selected aperture mask.

Further, a light emitted from the secondary light source 14 passes through the selected aperture mask and a condenser lens 15 and illuminates the photomask 1 disposed on a mask stage 16 (first installation member) with almost a uniform illumination.

The light passed through the photomask 1 is converged by a projection optical system 17, and the converged light projects a pattern image of the photomask 1 onto an inspection photosensitive substrate 18. The photosensitive substrate 18 is disposed on a substrate stage 19 (second installation member). It is assumed herein that the reduction ratio M of the projection optical system 17 is 1/4. The reduction ratio M is normally either 1/4 or 1/5.

A diaphragm 9 that specifies the size of a pupil 8 is provided in the projection optical system 17. A light far away from the central axis of the projection optical system 17 is shielded by the diaphragm 9. Therefore, a light flux passing near the edges of the diaphragm 9 is illuminated, a pattern representing the edges of the diaphragm 9 is transferred onto the photosensitive substrate 18. Which region of the pupil 8 the light flux emitted from the secondary light source 14 passes through is determined from the transfer position of the pattern representing the edges of the diaphragm 9.

The photosensitive substrate 18 comprises a silicon wafer having a diameter of 200 mm and a positive type photoresist applied onto this silicon wafer. Alternatively, a negative type photoresist may be employed in place of the positive type photoresist. The inspection photosensitive substrate 18 in the present embodiment comprises general-purpose members (the silicon wafer and the photoresist). Therefore, the manufacturing cost of the photosensitive substrate 18 is low.

In the present embodiment, when the exposure apparatus is inspected, the photomask 1 is set in the exposure apparatus and the surface of the secondary light source 14 of the illumination optical system 13 and that of the photosensitive substrate 18 are turned into an optically conjugate state.

When a semiconductor device pattern is exposed, the surface of the secondary light source 14 is optically conjugate with the pupil surface of the projection optical system 17 and the pattern surface of the photomask 1 is conjugate with the surface of the photosensitive substrate 18. In this case, a light intensity distribution on the surface of the secondary light source 14 and an image intensity on the pattern surface of the photomask 1 are expressed by a relationship of a Fourier transform pair.

In the present embodiment, as shown in FIG. 2, the photomask 1 is disposed on the mask stage 16 so that the direction of the pattern surface of the photomask 1 is opposite to the direction thereof (see FIG. 3), i.e., the photomask 1 is turned the other way. By doing so, it is unnecessary to set the pattern surface of the photomask 1 and the surface of the photosensitive substrate 18 to be optically conjugate with each other.

Here, when the pattern surface of the photomask 1 and the surface of the photosensitive substrate 18 are set to be optically conjugate with each other, information on the photomask 1 (pattern shape and dimension) is reflected on a resist pattern obtained by developing the photosensitive substrate 18. Information necessary for an illumination axis offset inspection is information on the illumination optical system and that on the projection optical system. The information on the photomask 1 is unnecessary.

In a case that the information on the photomask 1 is reflected on the resist pattern, the information on the photomask 1 needs to be differentiated from the information on the illumination optical system and that on the projection optical system. This may possibly complicate the inspection. To facilitate the inspection, therefore, the information on the photomask 1 is not reflected on the resist pattern.

In case that a photomask 1 without a pattern, i.e., a transparent substrate is used as will be described in a fifth embodiment later, the photomask 1 may be set to be optically conjugate with the photosensitive substrate 18.

Exposure is performed while the photomask 1 is disposed on the mask stage 16, the photosensitive substrate 18 is disposed on the substrate stage 19, and the photomask 1 and the photosensitive substrate 9 are stationary. This exposure is performed in each of two states of different illumination shapes of the secondary light source 14. That is, double exposures are performed.

FIGS. 4A an 4B are plan views illustrating the illumination shapes of the secondary light source 14 used in the embodiment. FIG. 4A illustrates an illumination shape 21 used in a first exposure, whereas FIG. 4B illustrates an illumination shape 22 used in a second exposure. The double exposures using these illumination shapes will now be described in detail.

It is assumed herein that the exposure of a pattern of a layer of a certain semiconductor device is conducted by the exposure apparatus having NA of 0.55 and σ of 0.85. To inspect this exposure apparatus, the first exposure is performed in a state (state 1) of NA =0.55 and σ=0.85. In this first exposure, the illumination shape 21 (secondary light source shape so that the position of the center of the secondary light source 14 appears) is used.

Symbol σ denotes a ratio of an emission-side numerical aperture NAill of the illumination optical system to an incidence-side numerical aperture NAin of the projection optical system 17 (NAill/NAin). Since NAin is NA×M (where M is the reduction ratio of the projection lens), the symbol a can be also expressed as NAill/(NA•M). The symbol NA (=0.55) denotes the emission-side numerical aperture of the projection optical system 17, σ is 0.85, and M is 1/4. Therefore, NAin is 0.1375 and NAill is 0.116875. A relationship of NAin>NAill is therefore held.

The second exposure is performed in a state (state 2) in which the NA is not changed and the illumination shape 21 is changed into the illumination shape 22. An illumination by the illumination shape 22 used in the second exposure is a zonal illumination with an outer periphery of a zone larger than σ=1 and an inner periphery thereof smaller than σ=1. Further, the illumination shape 22 used in the second exposure is selected so as not to be overlapped with the illumination shape 21 used in the first exposure.

In this case, NAi2 (=sin θ in) is smaller than NAin. The NAi2 is an angle θi2 represented by the dimension of the numerical aperture. The angle θi2 is an angle between a light that forms the inner periphery of the zone and a normal line of the surface of the photomask 1 (an incident angle of a light corresponding to the inner periphery of the secondary light source). Therefore, an inequality of NAill>NAin>NAi2 is satisfied in the present embodiment.

Considering that the first exposure has NAill of 0.116875, in the second exposure, an outer periphery of the zonal illumination is located so that NAin is larger than NAin=0.1375 and an inner periphery thereof is located so that NAin is smaller than NAin=0.1375 and larger than NAill=0.116875. To be specific, the outer periphery of the zonal illumination used in the second exposure is set to have a NAill of 0.15 and an inner periphery thereof is set to have a NAill of 0.125. In this case, the outside of an image of the secondary light source 14 projected onto the photosensitive substrate 18 is shielded by the diaphragm 9 of the projection optical system 17. In other words, the profile of the pupil 8 of the projection optical system 17 is projected onto the photosensitive substrate 18.

FIG. 5A illustrates a position (light flux position) 31 of a light flux emitted from the secondary light source 14 during the first exposure on the pupil surface of the projection optical system 17 and a diaphragm position 32. FIG. 5B illustrates a position (light flux position) 33 of a light flux emitted from the secondary light source 14 during the second exposure on the pupil surface of the projection optical system 17 and a diaphragm position 34.

On the pupil surface, a first region in which the light flux passes through during the first exposure is not overlapped with a second region in which the light flux passes through during the second exposure, and the profile of the diaphragm 9 is transferred by the light flux emitted during the second exposure. It is noted that the exposure order of the exposure in the state 1 and that in the state 2 may be changed. It is also assumed herein that the exposure quantity of the exposure in the state 1 is almost equal to that of the exposure in the state 2.

When the first exposure and the second exposure are finished, the photosensitive substrate 18 is taken out from the exposure apparatus. Development is then performed. FIG. 6 illustrates a resist pattern formed on the photosensitive substrate 18.

The resist pattern includes a resist pattern (hereinafter "inner pattern") 41 having the illumination shape and brightness distribution which reflect the state 1 in a center thereof and a zonal pattern (hereinafter, "outer pattern") 42 located around the inner pattern 41 and having the illumination shape and brightness distribution which reflect the state 2. In FIG. 6, reference symbol 43 denotes a circle which represents the outer periphery of the outer pattern 42, i.e., a circle which represents the pupil 8 of the projection optical system 17 (an image of the edges of the diaphragm 9 of the projection optical system 17).

The illumination optical system is inspected by measuring this resist pattern. First, the shape and brightness distribution of the secondary light source 14 are inspected by measuring the inner pattern 41. If the exposures are performed with respective appropriate exposure quantities, the photoresist in a high brightness region is dissolved and that in a low brightness region is not dissolved. Due to this, the illumination shape and brightness distribution of the secondary light source 14 are determined based on the relationship between the exposure quantities and the resist dissolution distribution.

On the other hand, the illumination axis offset is inspected by measuring the deviation between the center of the circle that represents the outer periphery of the inner pattern 41 and the center of the circle that represents the outer periphery of the outer pattern 42. In an ideal state of no illumination axis offset, the centers of the two circles coincide with each other.

On the other hand, if the deviation of the centers of the two circles is not zero (0), this indicates that the light flux emitted from the secondary light source 14 passes through a position deviated from the center of the pupil 8 of the projection optical system 17. This indicates that an illumination light incident on the projection optical system 17 is in an inclined state (an illumination axis offset state) as a whole and that the larger the deviation between the centers of the two circles is, the larger the illumination axis offset is.

Here, if an angle between the axis of a light incident on the photomask 1 (to be exact, the central axis of a conical light incident on the photomask 1 and having a finite dimension) and a normal of the surface of the photomask 1 on which the light is incident (the inclination of the central axis of the conical light incident on the photomask 1 and having a finite dimension) is set at θ radian, the illumination axis offset can be estimated according to the following equation (1):

$$\sin \theta = L \times NA/R \quad (1).$$

L: the distance between the center of the circle representing the outer periphery of the inner pattern 41 and the center of the circle representing the outer periphery of the outer pattern 42; and R: the radius of the circle representing the pupil 8 of the projection optical system 17.

Since L and R can be measured, the magnitude of the illumination axis offset (sin θ) can be obtained using the equation (1). The direction of the illumination axis offset can be estimated by, for example, an X coordinate and a Y coordinate of the center of the circle which represents the outer periphery of the outer pattern 42 in an X-Y coordinate system with the center of the circle which represents the outer periphery of the inner pattern 41 set as an origin.

In the present embodiment, exposure is performed in the two states of state 1 and state 2. However, an inspection target state is the state 1 and the illumination optical system 13 in the state 2 is not inspected.

The purpose of performing the exposure in the state 2 is to project the position of the diaphragm 9 in the state 1 (information on the projection optical system 17) onto the resist pattern by performing an exposure while keeping the state of the projection optical system 17 similar to the state 1. Due to this, even if a slight illumination axis offset occurs in the state 2, this does not influence the measurement as long as the light flux is projected onto the diaphragm 9. FIG. 7 illustrates an example of a resist pattern obtained in such a case.

As stated above, according to the first embodiment, the photomask 1 which can be easily manufactured is used as an inspection photomask instead of the photomask which has a fine structure and difficult to manufacture as used in the conventional method, whereby it is possible to inspect the illumination axis offset of the exposure apparatus at low cost.

In the present embodiment, the circular aperture portion 2 (pinhole) has a diameter of 55 μm. However, the diameter of the circular aperture portion 2 is not limited to 55 μm. This respect will be further explained below.

To accurately transfer an image of the secondary light source 14 onto the photosensitive substrate 18, the size of the circular aperture portion 2 must be appropriately set. Because if the aperture 2 is too large, the blur of the image on the photosensitive substrate 18 grows. Conversely, if the aperture 2 is too small, the image is blurred by diffraction, as well.

The appropriate size of the circular aperture portion 2 is related to the distance between the circular aperture portion 2 and the lower surface of the photomask 1 (thickness of the transparent substrate of the photomask 1) and an exposure wavelength. The inventors of the present invention confirmed by an experiment that if the thickness of the photomask 1 is 6.3 mm, a refractive index is about 1.5, and the exposure wavelength is 248 nm (wavelength of a KrF excimer laser), a resist pattern which represents an image of the secondary light source 14 having a good resolution is obtained on the photosensitive substrate 18 by setting the diameter of the circular aperture portion 2 to fall within a range of 50 to 60 μm Further, the inventors confirmed that even if the diameter of the aperture 2 slightly deviates from the diameter condition of 50 to 60 μm, a practically necessary accuracy is ensured by the circular aperture portion 2 having a diameter of 40 μm or more and 80 μm or less although the accuracy may be slightly lower and an inspection can be conducted.

In the case that the circular aperture portion 2 is provided on the surface (upper surface) of the photomask 1 and the exposure apparatus is inspected as., described in the present embodiment, a radius r of the circular aperture portion 2 is expressed by the following equation, where D is a distance from the circular aperture portion 2 to the lower surface of the photomask 1, λ is the exposure wavelength, and n is the refractive index of the transparent substrate:

$r=a(D\lambda/n)^{1/2}.$

In the equation, symbol a indicates a value of about 0.5 to 2.

SECOND EMBODIMENT

The difference in the second embodiment from the first embodiment is that an illumination shape in the state 2 is an illumination shape 52 having maximums of a brightness distribution in four directions longitudinally and laterally, respectively, as shown in FIG. 8B. As shown in FIG. 8, an illumination shape in the state 2 is a circular illumination shape 51, similar to the illumination shape 21 shown in FIG. 4A.

In the present embodiment, similar to the first embodiment, the illumination shape 52 in the state 2 is selected so as not to be overlapped with the illumination shape 51 in the state 1, the magnitude of a circle 53 corresponding to the outermost periphery of the illumination shape 52 in the state 2 is set to have σ larger than σ=1, and the magnitude of a circle 54 corresponding to the innermost periphery of the illumination shape 52 in the state 2 is set to have σ smaller than σ=1.

In this case, a resist pattern acquired includes a pattern 61 having the illumination shape and brightness distribution which reflect the state 1 in a center thereof, and four patterns 62 located around this pattern 61 and having the illumination shape and brightness distribution which reflect the state 2, as shown in FIG. 9.

A virtual circle 63 traced over the outer periphery of the pattern 62 corresponds to the circle 43 shown in FIG. 6 in the first embodiment, and indicates a circle representing the pupil 8 of the projection optical system 17 (an image of edges of the diaphragm 9 of the projection optical system 17).

The exposure apparatus can be similarly inspected to the first embodiment by changing the inner pattern 41, the outer pattern 42, and the circle 43 in the first embodiment to the pattern 61, pattern 62, and the circle 63, respectively.

In the present embodiment, the illumination shape 52 having maximums of the brightness distribution in four directions longitudinally and laterally, respectively, is employed. However, as long as an illumination shape has maximums of the brightness distribution in three or more directions, the measurement can be conducted in principle.

THIRD EMBODIMENT

The first difference in the third embodiment from the first embodiment is that the direction of the pattern surface of a photomask 1 is set equal to a direction for exposing a semiconductor device pattern as shown in FIG. 10. The photomask 1 in the present embodiment has a diameter of 15 μm, which is smaller than the diameter of the photomask 1 in the first embodiment. The other conditions for the photomask 1 are the same as those in the first embodiment.

The second difference of the third embodiment from the first embodiment is as follows. If the photomask 1 having such a diameter is used, the pattern surface of the photomask 1 is optically conjugate with the surface of the photosensitive substrate 18. Therefore, as shown in FIG. 10, the position of the surface of the photosensitive substrate 18 is moved by 30 μm from a position P1 at which mask pattern is transferred in a direction away from the projection optical system 17 in the direction of the normal of the surface of the photosensitive substrate 1, whereby the pattern surface of the photomask 1 is set not to be optically conjugate with the surface of the photosensitive substrate 18.

While the photomask 1 and the photosensitive substrate 18 are disposed as stated above and made stationary, exposure is performed. This exposure is performed in each of two states of different illumination shapes of the secondary light-source 14. That is, double exposures are performed.

Optical conditions for a first exposure are NA=0.55 and NAill=0.116875. In a second exposure, a zonal illumination with NA=0.55, an outer periphery of a zone is NAill=0.15 and an inner periphery thereof is NAill=0.125 is used. It is assumed herein that the exposure quantity of the exposure in the state 1 is almost equal to that of the exposure in the state 2.

When the first exposure and the second exposure are finished, the photosensitive substrate 18 is taken out from the exposure apparatus. Development is then performed. A resist pattern formed on the photosensitive substrate 18 is a similar figure to that shown in FIG. 6. This resist pattern includes a disc pattern formed at a center thereof and a zonal pattern located around this disc pattern. The illumination optical system is inspected according to the same procedures as those for the method described in the first embodiment.

In the present embodiment, the photosensitive substrate 18 is moved in the direction away from the projection optical system 17. However, even if the photosensitive substrate 18 is moved in a direction towards the projection optical system 17 to thereby turn the pattern surface of the photomask 1 and the surface of the photosensitive substrate 18 into a state in which they are not optically conjugate with each other, the same advantages can be attained.

In the present embodiment, the circular aperture portion (pinhole) has a diameter of 15 μm. However, the diameter of the circular aperture portion is not limited to 15 μm. This will be further explained below.

To accurately transfer an image of the secondary light source 14 onto the photosensitive substrate 18, the size of the circular aperture portion 2 must be appropriately set. Because if the aperture 2 is too large, the blur of the image on the photosensitive substrate 18 increases. Conversely, if the aperture 2 is too small, the image is blurred by diffraction, as well.

The appropriate size of the circular aperture portion 2 is related to the distance between the pattern surface of the photomask 1 and the surface of the photosensitive substrate 18 and an exposure wavelength. The inventors of the present invention confirmed by an experiment that if a distance (defocus length) of the deviation of the photosensitive substrate 18 from the position P1 is about 30 μm and the exposure wavelength is 248 nm, a resist pattern which represents an image of the secondary light source 14 having a good resolution is obtained on the photosensitive substrate 18 by setting the diameter of the circular aperture portion of the photomask 1 to fall within a range of 10 to 15 μm.

Further, the inventors confirmed that even if the diameter of the aperture 2 slightly deviates from the diameter condition of 10 to 15 μm, a practically necessary accuracy is ensured by the circular aperture portion 2 having a diameter of 1 μm or more and 20 μm or less although the accuracy may be slightly lower, and an inspection can be conducted.

FOURTH EMBODIMENT

FIG. 11 is an illustration for explaining an exposure apparatus inspection method in a fourth embodiment. In the present embodiment, the photomask 1 is disposed so as to turn the pattern surface thereof the other way. Further, a photosensitive substrate 18' having a structure shown in FIG. 12 is used.

The photosensitive substrate 18' is made of a material almost transparent relative to an exposure light 10 (exposure wavelength). As shown in FIG. 12, the photosensitive substrate 18' comprises a thin transparent substrate 70 made of a fused silica and having a thickness of 1 mm, a photoresist (photosensitizer) 71 provided on the surface of this transparent substrate 70 and having a transparency of transmitting part of the exposure light (exposure wavelength), and a chromium film (reflection film) 72 provided on the rear surface of the transparent substrate 70 to form the rear surface into a mirror finished surface and reflect the exposure light. The photoresist 71 is formed by an application method, and the chromium film 72 is formed by an evaporation method.

As described in the first embodiment (FIG. 1), the photomask 1 has the circular aperture portion 2. The diameter of the aperture 2 is set at 80 μm in the present embodiment. The pattern surface of the photomask 1 is optically conjugate with the surface of the photosensitive substrate 18'.

A first exposure and a second exposure are performed under the same optical conditions as those in the third embodiment. As shown in FIG. 12, an exposure light that reaches the surface of the photosensitive substrate 18' photosensitizes the photoresist 71 to form an image (a first image) of the pattern of the photomask 1. The exposure light is further passed through the photoresist 71 and the transparent substrate 70, reflected by the chromium film 72 (mirror finished surface of the rear surface of the photosensitive substrate 18'), reaches the surface of the photosensitive substrate 18' again, and photosensitizes the photoresist 71 to thereby form an image (a second image).

Here, since the pattern surface of the photomask 1 and the surface of the photosensitive substrate 18' are optically conjugate with each other, the pattern surface of the photomask 1 and the surface of the photosensitive substrate 18' in a region in which the first image is formed are optically conjugate.

However, the optical path of the light reflected by the rear surface of the photosensitive substrate 18' is longer than that of the light reflected by the surface of the photosensitive substrate 18'. Due to this, the pattern surface of the photomask 1 and the surface of the photosensitive substrate 18' in a region in which the second image is formed are not optically conjugate with each other.

Namely, the light that forms the second image, substantially similarly to the third embodiment, exposes the photosensitive substrate 18' moved from a mask pattern transfer position in a direction away from the projection optical system 17.

When the first exposure and the second exposure are finished, the photosensitive substrate 18' is taken out from the exposure apparatus. Development is then performed. FIG. 13 illustrates a resist pattern formed on the photosensitive substrate 18'. The resist pattern includes a pattern 81 provided at a center thereof and corresponding to the reduced image (first image) of the pattern of the photomask 1, and patterns 82 provided around the pattern 81 and corresponding to the second image formed by photosensitizing the photoresist 71 by the light reflected by the mirror finished surface on the rear surface of the photosensitive substrate 18'.

In FIG. 13, reference symbol 83 denotes a circle which represents the outer periphery of the pattern 82, i.e., an image of the edges of the diaphragm 9 of the projection optical system 17. Further, the inner circular pattern out of the two patterns 82 corresponds to the pattern 41 shown in FIG. 6 and the outer zonal pattern corresponds to the pattern 42 shown in FIG. 6.

The illumination optical system is inspected for the patterns 82 according to the same procedures as those for the method described in the first embodiment. At this time, the diameter of the pattern 81 is 1/100 or less of those of the patterns 82, thus the pattern 81 does not obstruct analysis.

FIFTH EMBODIMENT

The difference in the fifth embodiment from the first embodiment is that a lens array 90 as shown in FIGS. 14A to 14B is used in place of the photomask 1 so that the surface of the secondary light source 14 of the illumination optical system 13 is optically conjugate with the surface of the photosensitive substrate 18. Further, the lens array 90 is incorporated into an exposure apparatus.

The lens array 90 includes a lens holder 91 transparent relative to an exposure light (exposure wavelength), and a plurality of lenses 92 disposed on this lens holder 91 fixed in a matrix. FIG. 14A is a side view and FIG. 14B is a top plan view of the lens array 90.

The lens holder 91 is supported by an arm 93 (a retraction member) controlled by a driving mechanism, not shown, to be inserted into or retracted from an optical path. By doing so, the lens array 90 is retracted out of the optical path during the exposure of an arranged semiconductor device pattern, and inserted into the optical path of the exposure light during the inspection of the illumination optical system as shown in FIG. 15.

At this time, the lens holder 91 is inserted into an upper portion of the surface of the photomask 1 so that a surface (lens surface) on which the lenses 92 are arranged is parallel to the surface of the photo-sensitive substrate 18. The photomask 1 is a simple transparent substrate which does not include a pattern and can be omitted.

Furthermore, the lens array 90 is disposed at a position above the surface of the photomask in a perpendicular direction to the surface of the photomask to be away from the surface by a predetermined distance. The predetermined distance is the focal length of each lens 92 for an exposure wavelength light or a distance almost equal to the predetermined distance (a distance substantially equal to the focal length). By disposing the lens array 90 at such a position, a clear resist pattern (image) can be formed on the photosensitive substrate 18.

In this state, the surface of the secondary light source 14 is optically conjugate with the surface (lower surface) of the photomask 1, and the rear surface (lower surface) of the photomask 1 is optically conjugate with the rear surface of the photosensitive substrate 18. Due to this, the surface of the secondary light source 14 is optically conjugate with the surface of the photosensitive substrate 18.

In a case that the photomask 1 (transparent substrate) is not used, and the photomask 1 (transparent substrate) is assumed to be virtually provided, the lens array 90 is disposed so that a focal point of the array 90 is located on the surface of the virtual photomask 1 (transparent substrate). The photomask 1 can be omitted. However, if the photomask 1 which serves as a standard for positioning of the lens array 90 is actually provided, positioning is accurately facilitated.

While the lens array 90 is inserted, the exposure method described in the first embodiment is carried out to thereby obtain a resist pattern and the resist pattern is analyzed similarly to the first embodiment, whereby the illumination optical system can be inspected.

Moreover, the lens array 90 which is a necessary mechanism to inspect the illumination optical system 13 of the exposure apparatus and the driving mechanism, not shown, for driving the lens array 90 are provided in the exposure apparatus. In the present embodiment, therefore, the inspection can be conducted simply, as compared with a case of preparing the mechanism necessary for the inspection whenever the inspection is conducted.

While FIGS. 14A to 14B and 15 illustrate the thick lenses 92, the same advantages can be attained even by using a circular aperture portion or a zone plate.

In the present embodiment, since the lens array 90 is used, the inspection of an entire exposure field is performed at one time. However, even if one lens is used, a plurality of exposures are performed while changing the arrangement position of the lens and development is then performed, the same inspection result as that in the present embodiment can be attained. If the lens array 90 is employed, the inspection can be carried out in a short time. If one lens is employed, system cost can be reduced.

Figure 16B:
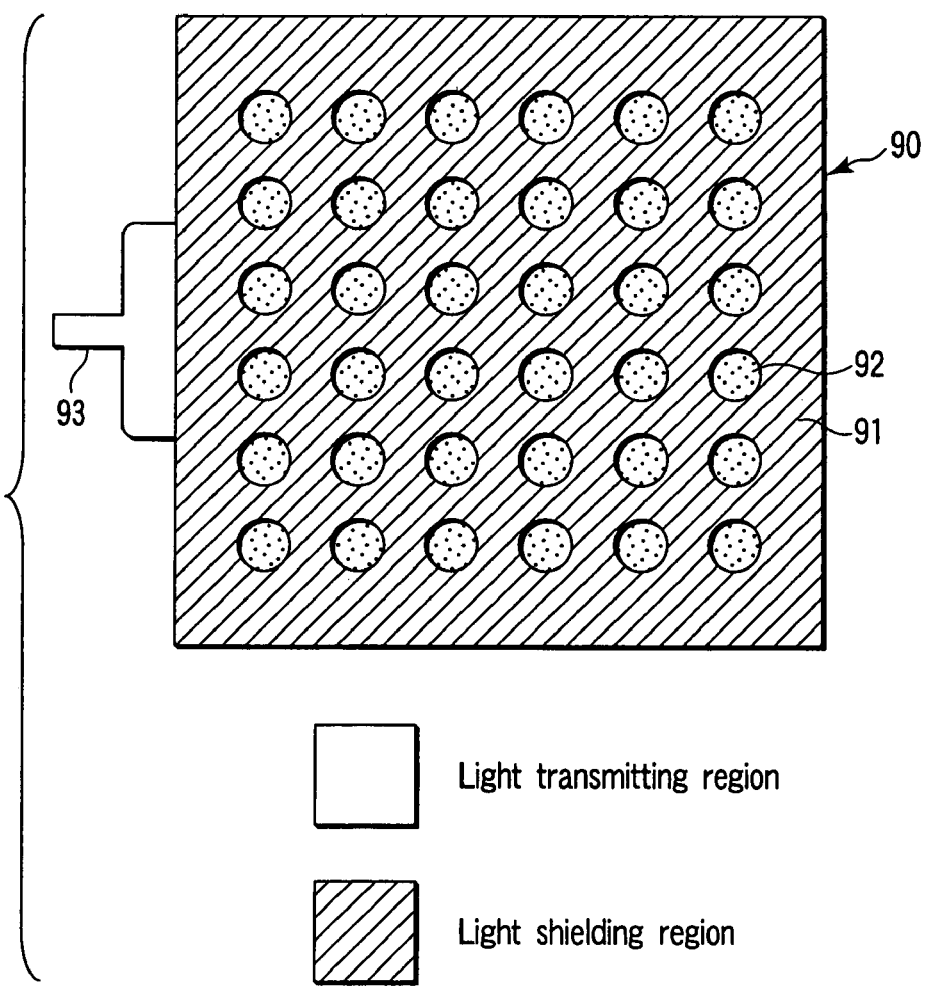

FIGS. 16A and 16B illustrate a modification of the lens array 90. A lens array 90' in this modification includes a lens holder 91 having a region in which lenses 92 are provided is a transparent region relative to an exposure light and a region in which the lenses 92 are not provided is a light shielding region relative to the exposure light.

Such a lens array 90' can be realized by using, as the lens holder 91, a lens holder comprising, for example, a transparent substrate and a light shielding film having an aperture formed in the region in which the lenses 92 are provided.

By using such a lens array 90', only the exposure light illuminated onto the surface of the lens holder 91 in the region in which the lenses 92 are provided reaches the lenses 92 and the photosensitive substrate 18. This can prevent an unnecessary exposure light from reaching, as a stray light, the photosensitive substrate 18. It is thereby possible to prevent the shape of the measurement pattern from being deteriorated by the stray light and ensure measurement with higher accuracy.

SIXTH EMBODIMENT

FIG. 17 is an illustration for explaining an exposure apparatus inspection method in a sixth embodiment.

The sixth embodiment is different from the fifth embodiment in that the lens array 90 is inserted between the illumination optical system 12 and the projection optical system 17, i.e., between the photomask 1 and the projection optical system 17. In this case, the lens array 90 is inserted at a position at which the distance from the photomask 1 is the position of a focal length of the lenses 92 which corresponds to an exposure wavelength light or almost equal to the position of the focal length.

By inserting the lens array 90 at such a position, the same measurement as that in the fifth embodiment can be carried out. In addition, the same modification as that of the fifth embodiment can be made to the sixth embodiment.

SEVENTH EMBODIMENT

Figure 18:
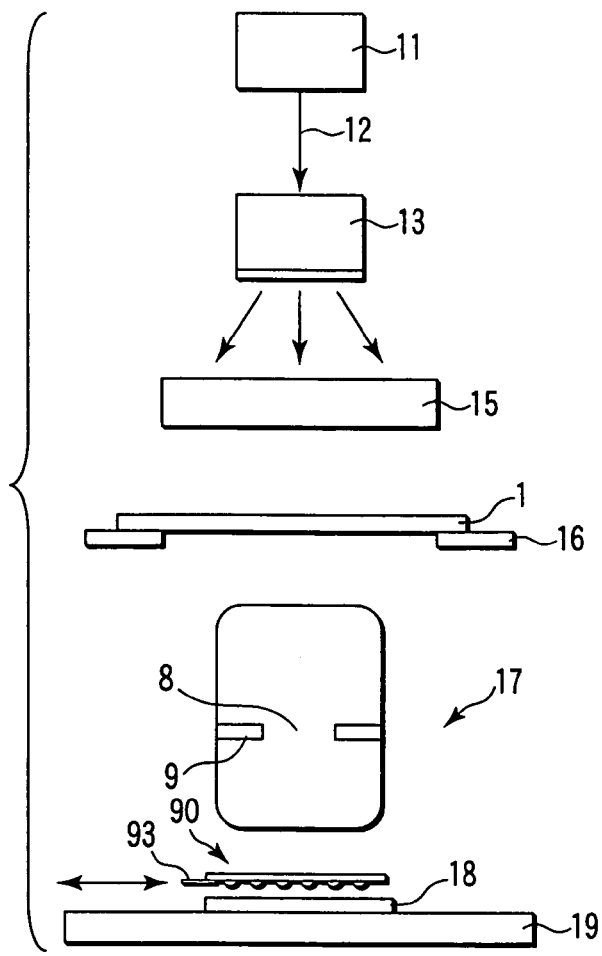
FIG. 18 is an illustration for explaining an exposure apparatus inspection method in a seventh embodiment.
Figure 19A:
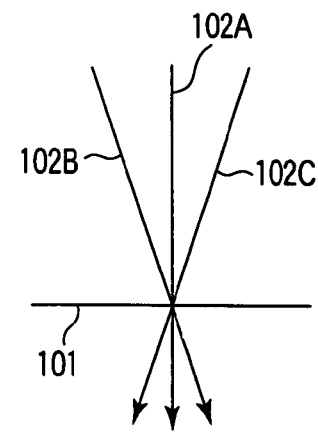
FIGS. 19A to 19D are illustrations for explaining the influence of the illumination axis offset of an exposure apparatus.
Figure 19B:
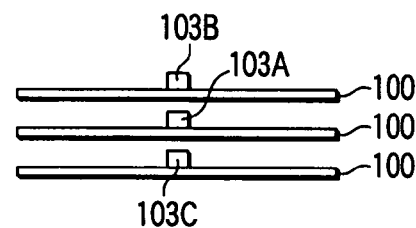
Figure 19C:
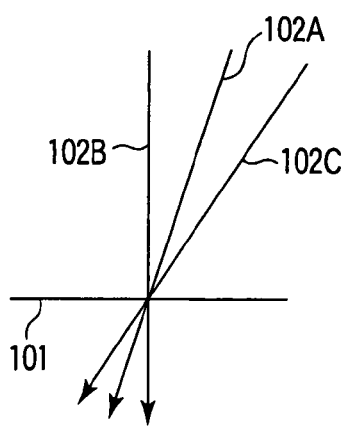
Figure 19D:
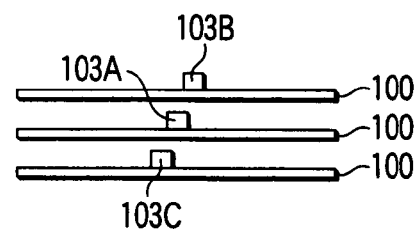
Figure 20:
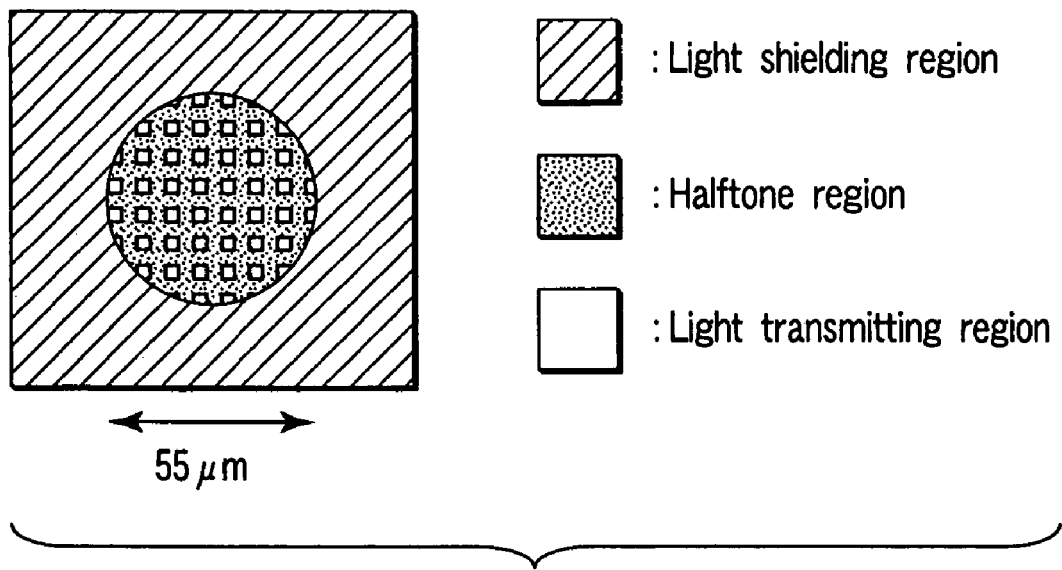
FIG. 20 is a plan view illustrating a grating pinhole used in a conventional illumination axis offset measurement method.
Figure 21:
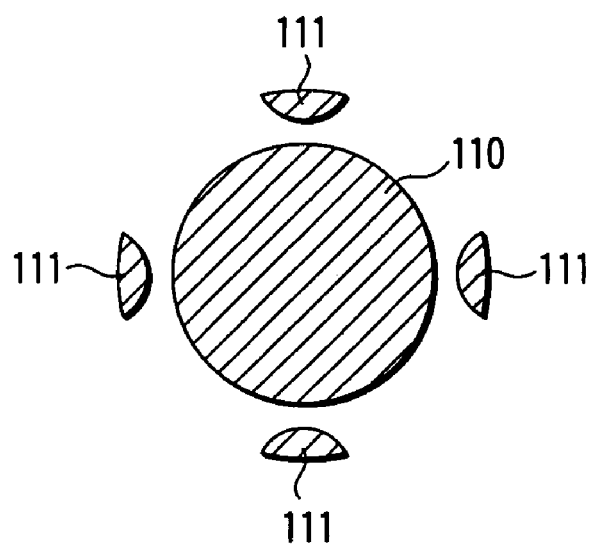
FIG. 21 is a plan view illustrating a pattern on a photosensitive substrate formed by the conventional illumination axis offset measurement method.

FIG. 18 is an illustration for explaining an exposure apparatus inspection method in a seventh embodiment.

The seventh embodiment is different from the fifth embodiment in that the lens array 90 is inserted between the projection optical system 17 and the photosensitive substrate 18. In the present embodiment, the lens array 90 is inserted at a position where the focus corresponding to the exposure wavelength light of the lens array 90 is on the surface of the photosensitive substrate 18 or near the surface thereof, whereby the same measurement as that in the fifth embodiment can be carried out. In addition, the same modification as that of the fifth embodiment can be made to the seventh embodiment.

It should be noted that the present invention is not limited to the above-stated embodiments. For example, while the photomask (pinhole camera) 1 or lens array 90 is employed so as to turn the surface of the secondary light source of the illumination optical system and the surface of the photosensitive substrate into a conjugate state, the other pattern member may be employed to do so.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An inspection method for an exposure apparatus for projecting a surface of a secondary light source of an illumination optical system onto a substrate through a projection optical system, the inspection method comprising:
    preparing an inspection photosensitive substrate as the substrate;
    illuminating a first region which does not include a pupil end of the projection optical system and illuminating a second region which includes the pupil end of the projection optical system and which is not overlapped with the first region before the illuminating the first region or after the illuminating the first region, in a state in which a surface of the photosensitive substrate and the surface of the secondary light source of the illumination optical system are optically conjugate with each other;
    inspecting an illumination axis offset of the exposure apparatus based on a pattern obtained by developing the photosensitive substrate; and
    wherein the state in which the surface of the photosensitive substrate and the surface of the secondary light source of the illumination optical system are optically conjugate with each other is formed by providing a pattern member comprising a pattern formed on a surface between the illumination optical system and the projection optical system or between the projection optical system and the photosensitive substrate.

2. The exposure apparatus inspection method according to claim 1, wherein the pattern member is an inspection photomask comprising a surface on which a pattern is formed, and the inspection photomask is provided on an installation member so that the surface of the inspection photomask is not optically conjugate with the surface of the projection substrate.

3. The exposure apparatus inspection method according to claim 2, wherein the pattern of the inspection photomask includes a circular pattern transparent relative to an exposure light.

4. The exposure apparatus inspection method according to claim 3, further comprising disposing the inspection photomask on the installation member while the surface on which the circular pattern, is provided is oriented toward the sprface of the secondary light source to set the surface on which the circular pattern of the inspection photomask is formed and the surface of the photosensitive substrate not to be optically conjugate with each other.

5. The exposure apparatus inspection method according to claim 4, wherein a diameter of the circular pattern is 40 μm or more and 80 μm or less.

6. The exposure apparatus inspection method according to claim 3, wherein the inspection photomask is disposed on the first installation member so that the surface on which the circular pattern is formed is directed toward a pupil of the projection optical system.

7. The exposure apparatus inspection method according to claim 6, further comprising controlling a distance between the pupil of the projection optical system and the surface of the photosensitive substrate to set the surface of the inspection photomask on which the circular pattern is formed and the surface of the photosensitive subtract not to be optically conjugate with each other.

8. The exposure apparatus inspection method according to claim 6, wherein the photosensitive substrate comprises a transparent substrate relative to the exposure light and a reflection film provided on a surface of the substrate opposite to a surface of the substrate on which the exposure light is incident and reflecting the exposure light.

9. The exposure apparatus inspection method according to claim 6, wherein the diameter of the circular pattern is 1 μm or more and 20 μm or less.

10. The exposure apparatus inspection method according to claim 1, wherein the photosensitive substrate comprises a silicon wafer, and a photoresist applied onto the silicon wafer.

11. The exposure apparatus inspection method according to claim 1, wherein the pattern member is a lens member, and the lens member is disposed in an optical path between the surface of the secondary light source of the illumination optical system and the projection optical system or in an optical path between the projection optical system and the photosensitive substrate.

12. The exposure apparatus inspection method according to claim 1, further comprising setting an illumination shape of the secondary light source in a zonal pattern by illuminating the second region when the photosensitive substrate is exposed.

13. The exposure apparatus inspection method according to claim 1, further comprising setting an illumination shape of the secondary light source in a shape which has maximums of brightness in three or more directions when the photosensitive substrate is exposed.

14. The exposure apparatus inspection method according to claim 12, wherein the illumination shape of the secondary light source on a pupil surface of the projection optical system satisfies an inequality of $NAill > NAin > NAi2$, where $NAin$ is an incident-side numerical aperture of the projection optical system, $NAill$ is an emission-side numerical aperture of the illumination optical system, and $NAi2$ is a value representing an incident angle of a light corresponding to an inner periphery of the secondary light source by a numerical aperture dimension.

* * * * *

UNITED STATES PATENT AND TRADEMARK OFFICE
CERTIFICATE OF CORRECTION

PATENT NO.        : 7,327,449 B2
APPLICATION NO.   : 11/806976
DATED             : February 5, 2008
INVENTOR(S)       : Fukuhara et al.

It is certified that error appears in the above-identified patent and that said Letters Patent is hereby corrected as shown below:

Claim 4, column 15, line 54, change "sprface" to --surface--.

Signed and Sealed this

Twenty-seventh Day of May, 2008

JON W. DUDAS
*Director of the United States Patent and Trademark Office*